United States Patent
Zou

(10) Patent No.: US 10,854,779 B2
(45) Date of Patent: Dec. 1, 2020

(54) MICRO-LED TRANSFER METHOD AND MANUFACTURING METHOD

(71) Applicant: GOERTEK. INC, Weifang (CN)

(72) Inventor: Quanbo Zou, Weifang (CN)

(73) Assignee: GOERTEK. INC, Weifang (CN)

( * ) Notice: Subject to any disclaimer, the term of this patent is extended or adjusted under 35 U.S.C. 154(b) by 0 days.

(21) Appl. No.: 16/347,614

(22) PCT Filed: Nov. 7, 2016

(86) PCT No.: PCT/CN2016/104928
§ 371 (c)(1),
(2) Date: May 6, 2019

(87) PCT Pub. No.: WO2018/082102
PCT Pub. Date: May 11, 2018

(65) Prior Publication Data
US 2019/0319164 A1    Oct. 17, 2019

(51) Int. Cl.
*H01L 33/00* (2010.01)
*H01L 33/62* (2010.01)
(Continued)

(52) U.S. Cl.
CPC .... *H01L 33/0095* (2013.01); *H01L 21/67242* (2013.01); *H01L 22/12* (2013.01); *H01L 22/14* (2013.01); *H01L 22/22* (2013.01); *H01L 24/83* (2013.01); *H01L 25/0753* (2013.01); *H01L 33/62* (2013.01); *H01L 2221/68363* (2013.01);
(Continued)

(58) Field of Classification Search
CPC ............... H01L 33/0095; H01L 33/62; H01L 21/67242; H01L 22/12; H01L 22/14; H01L 22/22; H01L 2221/68363; H01L 2221/68368
See application file for complete search history.

(56) References Cited

U.S. PATENT DOCUMENTS

| | | | |
|---|---|---|---|
| 6,335,263 B1 | 1/2002 | Cheung et al. | |
| 2002/0036055 A1* | 3/2002 | Yoshimura | H01L 24/82 156/234 |

(Continued)

FOREIGN PATENT DOCUMENTS

| | | |
|---|---|---|
| CN | 104106149 A | 10/2014 |
| CN | 104335339 A | 2/2015 |

(Continued)

*Primary Examiner* — Matthew E Warren
(74) *Attorney, Agent, or Firm* — Ajay A. Jagtiani; Miles & Stockbridge P.C.

(57) ABSTRACT

Disclosed a micro-LED transfer method and manufacturing method. The micro-LED transfer method comprises: bringing pickup units (305, 605, 705) of a transfer head in contact with micro-LEDs (303, 603, 703) on a carrier substrate (301, 601, 701), wherein the pickup units (305, 605, 705) are able to apply current to the micro-LEDs (303, 603, 703); applying current to the micro-LEDs (303, 603, 703) via the pickup units (305, 605, 705) to obtain I-V characteristics of the micro-LEDs (303, 603, 703); determining known-good-die micro-LEDs based on the I-V characteristics; and transferring the known-good-die micro-LEDs from the carrier substrate to a receiving substrate (307, 608, 708) by using the transfer head.

10 Claims, 7 Drawing Sheets

(51) Int. Cl.
*H01L 21/66* (2006.01)
*H01L 21/67* (2006.01)
*H01L 23/00* (2006.01)
*H01L 25/075* (2006.01)

(52) U.S. Cl.
CPC .............. *H01L 2221/68368* (2013.01); *H01L 2224/83* (2013.01)

(56) References Cited

U.S. PATENT DOCUMENTS

| | | |
|---|---|---|
| 2011/0207253 A1 | 8/2011 | Yang |
| 2017/0215280 A1* | 7/2017 | Chaji ..................... H05K 1/111 |
| 2018/0069148 A1* | 3/2018 | Zou ......................... H01L 24/03 |
| 2019/0252350 A1* | 8/2019 | Schwarz ............. H01L 33/0095 |

FOREIGN PATENT DOCUMENTS

| | | |
|---|---|---|
| CN | 105144387 A | 12/2015 |
| CN | 105518877 A | 4/2016 |
| WO | 2013/074370 A1 | 5/2013 |
| WO | 2013/169545 A1 | 11/2013 |
| WO | 2014/149864 A1 | 9/2014 |
| WO | 2017/028207 A1 | 2/2017 |

\* cited by examiner

MICRO-LED TRANSFER METHOD AND MANUFACTURING METHOD

CROSS-REFERENCE TO RELATED APPLICATIONS

This application is a National Stage of International Application No. PCT/CN2016/104928 filed on Nov. 7, 2016, which is incorporated herein by reference in its entirety.

FIELD OF THE INVENTION

The present invention relates to the field of micro-LED, and more specifically, relates to a micro-LED transfer method and a method for manufacturing a micro-LED device.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LEDs will have a deep affection on the conventional display products such as LCD/OLED that have already been put into the market.

Generally, during manufacturing a display device such as a display panel, micro-LEDs will be transferred from a carrier substrate, such as a growth substrate or a substrate that picks up micro-LEDs from the growth substrate, to a receiving substrate such as a display substrate and so on. In the prior art, a transfer head will be used for such a transfer.

For example, U.S. Pat. No. 8,426,227 B1 discloses a method of forming a micro light emitting diode array, which is hereby incorporated herein by reference.

U.S. Pat. No. 8,518,204 B2 discloses a method of fabricating and transferring a micro device and an array of micro devices utilizing an intermediate electrically conductive bonding layer, which is hereby incorporated herein by reference.

In the prior, during transfer, the micro-LEDs will be heated up so that a bonding layer for the micro-LEDs is melted and the micro-LEDs are ready for transfer, such as lifting up, bonding to a receiving substrate and so on. During transfer, the micro-LEDs may experience several heating cycles. Generally, a transfer head may just pick up some of the micro-LEDs on a carrier substrate each cycle. The transfer head will transfer three-color micro-LEDs (red, blue and green) in three cycles. During each cycle, all micro-LEDs are heated up to be melted even though only some of them are to be picked up and/or to be bonded. Accordingly, the performance of the micro-LEDs may be degraded. Optionally, the through-put and/or reliability may be reduced.

Furthermore, if a micro-LED shall be repaired, all the micro-LEDs on the substrate will be heated up. Accordingly, more thermal budgets will be required for all micro-LEDs on whole substrate.

In addition, an examination process for bad micro-LEDs and the transfer process are separate. During transfer, bad micro-LEDs may also be picked up and transferred, which may complicate a repair procedure.

Therefore, there is a demand in the art that a new solution for transferring micro-LEDs by using a transfer head shall be proposed to address at least one of the problems in the prior art.

SUMMARY OF THE INVENTION

One object of this invention is to provide a new technical solution for transferring micro-LEDs.

According to a first aspect of the present invention, there is provided a micro-LED transfer method, comprising: bringing pickup units of a transfer head in contact with micro-LEDs on a carrier substrate, wherein the pickup units are able to apply current to the micro-LEDs; applying current to the micro-LEDs via the pickup units to obtain I-V characteristics of the micro-LEDs; determining known-good-die micro-LEDs based on the I-V characteristics; and transferring the known-good-die micro-LEDs from the carrier substrate to a receiving substrate by using the transfer head.

Alternatively or optionally, transferring the known-good-die micro-LEDs further comprising: applying current to the known-good-die micro-LEDs via the pickup units to heat up bonding layers between the known-good-die micro-LEDs and the carrier substrate to be melted; picking up the known-good-die micro-LEDs from the carrier substrate with the transfer head; bonding the known-good-die micro-LEDs onto a receiving substrate; and removing the transfer head from the known-good-die micro-LEDs.

Alternatively or optionally, the pickup units include electrodes on a transfer substrate of the transfer head and a conductive adhesive layer on the electrodes; the current is applied via the electrodes and the conductive adhesive layer; the known-good-die micro-LEDs are picked up by means of the conductive adhesive layer; and the conductive adhesive layer is removed after the known-good-die micro-LEDs are bonded onto the receiving substrate.

Alternatively or optionally, the conductive adhesive layer is blank.

Alternatively or optionally, the conductive adhesive layer is a conductive photoresist layer, the conductive photoresist layer is cured during heating up the bonding layers between the known-good-die micro-LEDs and the carrier substrate, and the conductive photoresist layer is chemically removed after the known-good-die micro-LEDs are bonded onto the receiving substrate.

Alternatively or optionally, the pickup units of the transfer head are in flexible contact with the micro-LEDs on the carrier substrate.

Alternatively or optionally, the pickup units of the transfer head pick up the known-good-die micro-LEDs from the carrier substrate by electrostatic force or electromagnetic force.

Alternatively or optionally, each of the pickup units of the transfer head includes at least one picking up electrode and at least one current-applying electrode, the picking up electrode is covered with a dielectric layer, a metal probe is mounted on the current-applying electrode for applying current to the micro-LEDs on the carrier substrate.

Alternatively or optionally, the melting of the bonding layers between the known-good-die micro-LEDs and the carrier substrate is determined by monitoring an I-V characteristics of the known-good-die micro-LEDs.

According to a second aspect of the present invention, there is provided a method for manufacturing a micro-LED device, comprising transferring micro-LEDs onto a receiving substrate of the micro-LED device by using the micro-LED transfer method according to the present invention.

According to an embodiment of this invention, the present invention can determine micro-LEDs of known good dies before transferring it to a receiving substrate.

Further features of the present invention and advantages thereof will become apparent from the following detailed description of exemplary embodiments according to the present invention with reference to the attached drawings.

BRIEF DISCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
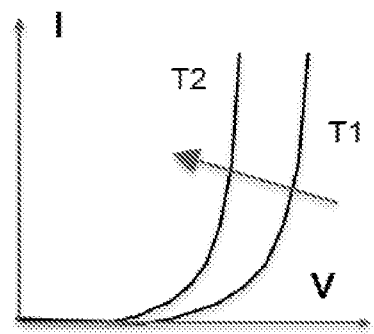
FIG. 1 is a schematic graph showing I-V characteristics of a micro-LED.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Examples and embodiments of the present invention will be illustrated as below with reference to the drawings.

In the embodiments of the present invention, it is proposed to heat a bonding layer of a micro-LED during a transfer by means of applying current to the micro-LED. In this way, the heating can be local, i.e. only the micro-LED to which the current is applied is heated up while other micro-LEDs remain un-heated.

Through selectively application of current, an easy selective or programmable heating can be realized. In this way, a selective or programmable pickup or transfer can be performed. Because a display substrate such as a display panel has micro-LED arrays of three colors and a growth substrate generally has only a micro-LED array of only one color, selective transfer of micro-LEDs from a growth substrate to a display substrate will be of benefit to the manufacture of a display device. Alternatively, in a case of repairing a display substrate, the selective or programmable transfer will even be of benefit.

In addition, the temperature of a micro-LED can be determined by an I-V characteristics thereof. Because the micro-LED is bonded on a substrate via a bonding layer such as solder and is very close to the bonding layer, the temperatures in the micro-LED and in the bonding layer are almost the same. Accordingly, the temperature in the bonding layer can also be determined by the I-V characteristics. In view of this, the melting status of the bonding layer can be sensed through the I-V characteristics. It should be understood by a person skilled in the art that the melting status of a bonding layer can also be determined in other ways. For example, if a transfer head can lift up a micro-LED, it means the bonding layer is melted.

FIG. 1 is a schematic graph showing I-V characteristics of a micro-LED. In FIG. 1, a temperature T1 is lower than T2. The I-V curve of T1 is on the right of that of T2, wherein V is a forward voltage Vf of the micro-LED and I is a current flowing through the micro-LED. As can be seen in FIG. 1, under a certain current, the forward voltage Vf of the micro-LED will decrease with the temperature increasing. The typical temperature coefficient for a red micro-LED is of $-1.8$ mV/° C. The typical temperature coefficient for a green micro-LED is of $-3.8$ mV/° C. The typical temperature coefficient for a blue micro-LED is of/$-3.3$ mV/° C.

Figure 2:
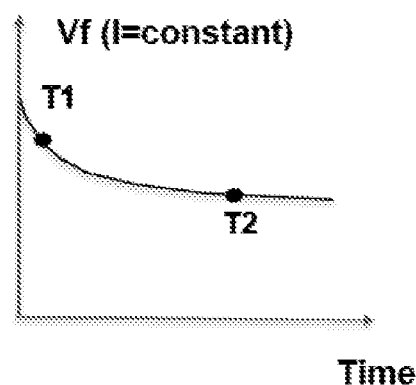
FIG. 2 is a schematic graph showing voltage changes of a micro-LED.

FIG. 2 is a schematic graph showing forward voltage (Vf) changes of a micro-LED. As shown in FIG. 2, in a case where the current I is constant, the Vf will decrease with time. This means that the temperature is increasing. For example, in FIG. 2, T2 is higher than T1.

So, the temperature of a micro-LED can be determined by monitoring the voltage thereof. Because the bonding layer such as a solder is very close to the micro-LED and they are in a good thermal conductive relationship, the temperature and/or the melting status of the bonding layer can also be determined by the I-V characteristics.

In another aspect, from the I-V characteristics, a good micro-LED may be determined. That is, in most situations, a good micro-LED will show a proper I-V characteristics while a bad one does not, and when the bonding layer of a good micro-LED is melted, the bad one may not be melted. So, by the heating of applying current, only micro-LEDs of known good dies (KGD) will be transferred to some degree.

In the embodiments of the present invention, the transfer head has a functionality of gripping a micro-LED and a functionality of applying current to the micro-LED.

Figure 3:
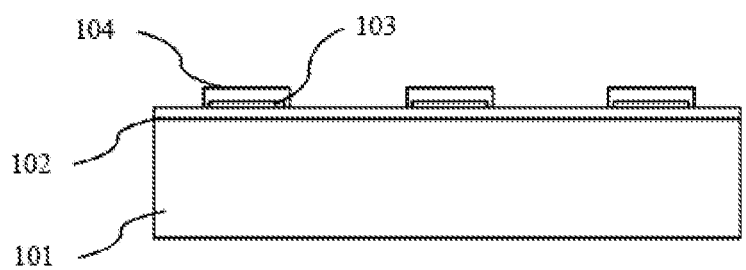
FIG. 3 shows a transfer head according to an embodiment of the present invention.

FIG. 3 shows a transfer head according to an embodiment of the present invention. As shown in FIG. 3, the transfer head comprises a transfer substrate 101 and pickup units mounted on a surface of the transfer substrate 101. A pickup unit includes a grip mechanism 104 and a current-applying mechanism 103.

The grip mechanism 104 is able to capture a micro-LED. For example, the grip mechanism can capture the micro-LED through at least one of adhesion force, electrostatic force, and electromagnetic force. The current-applying mechanism 103 is able to apply current to the micro-LED so that a bonding layer between the micro-LED and a carrier substrate is heated up to be melted.

For example, in FIG. 3, the current-applying mechanism 103 is an electrode on the transfer substrate 101. The electrode 103 can be mounted on the transfer substrate via a dielectric layer 102. A lead may be arranged in the transfer substrate 101 and/or the dielectric layer 102 to connect the electrode 103 to a current source. The grip mechanism 104 is a conductive adhesive layer on the electrode. The electrode 103 applies current to a micro-LED to be transferred via the conductive adhesive layer 104. The micro-LED can be picked up by means of the conductive adhesive layer 104. The conductive adhesive layer 104 may be removed after the micro-LEDs are bonded onto a receiving substrate.

Although it is not shown, a mechanism of monitoring a voltage across the micro-LED during the current-applying mechanism is applying current to the micro-LED can be arranged in the transfer head or it can be arranged in other position. By this arrangement, the melting status of a bonding layer can be determined. Under the teaching of this invention, a person skilled in the art will conceive many approaches to monitor the voltage, for example, through a voltage sensor probe. How to monitor a voltage is not what to be claimed in this invention and thus will not be described in detail.

In an example, the conductive adhesive layer 104 is a conductive photoresist layer. The conductive photoresist layer 104 may be soft-baked to allow further bonding with a micro-LED. For example, the material of conductive photoresist layer 104 can GCM3060 SU8 resist with metallic particles. The conductive photoresist layer 104 may be cured during the bonding layer between the micro-LED and a carrier substrate (or the micro-LED) is heated up. After the micro-LEDs are bonded onto a receiving substrate, the conductive photoresist layer 104 may be chemically removed.

In FIG. 3, the conductive adhesive layer 104 is patterned so that the pickup units are separated.

Figure 4:
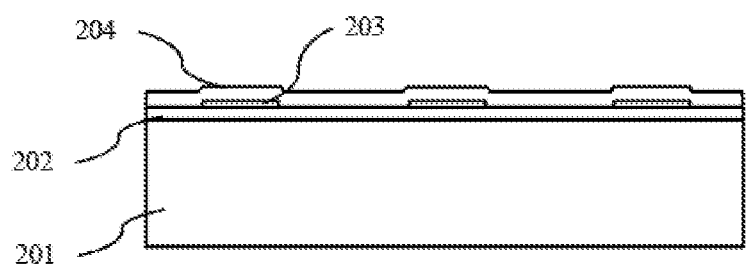
FIG. 4 shows a transfer head according to another embodiment of the present invention.

FIG. 4 shows a transfer head according to another embodiment of the present invention. As shown in FIG. 4, the transfer head includes a transfer substrate 201, a dielectric layer 202, an electrode 203 and a conductive adhesive layer 204. The corresponding parts of the transfer head of FIG. 4 are similar with those of FIG. 3 and the repetitive description thereof is omitted.

The difference between the transfer head of FIG. 4 and that of FIG. 3 lies in that the conductive adhesive layer 204 on multiple of the pickup units is not patterned and is blank. Because the lateral thermal resistance is larger than vertical one, the local heating can be guaranteed. This allows for a simplified flow of forming the conductive adhesive layer. Since the current will flow mainly in the direction to the micro-LED and the leakage current between two pickup units can be negligible, this arrangement of conductive adhesive layer will not have influence on the functionality of the transfer head and will significantly simplify the forming of the conductive adhesive layer.

FIGS. 5-10 shows a process of transferring micro-LEDs from a carrier substrate to a receiving substrate according to another embodiment of the present invention.

For example, in this embodiment, a transfer head of FIG. 3 or 4 may be used.

Figure 5:
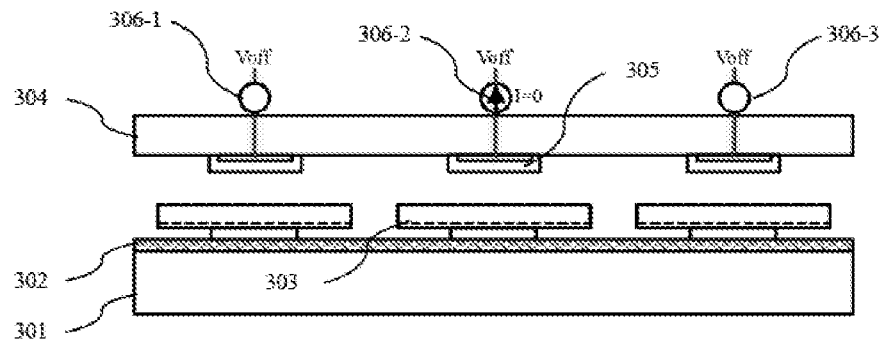
FIGS. 5-10 shows a process of transferring micro-LEDs from a carrier substrate to a receiving substrate according to another embodiment of the present invention.

In FIG. 5, the transfer head is aligned to a carrier substrate 301. The transfer head may include a transfer substrate 304 and pickup units 305. The pickup units 305 can apply current to micro-LEDs and pick up micro-LEDs. For example, the transfer head can be a transfer head shown in FIG. 3 or 4.

Current sources 306-1, 306-2, 306-3 are connected to the pickup units 305.

Micro-LEDs 303 are arranged on the carrier substrate 301 via a bonding layer 302. The bonding layer 302 can be conductive, for example.

Figure 6:
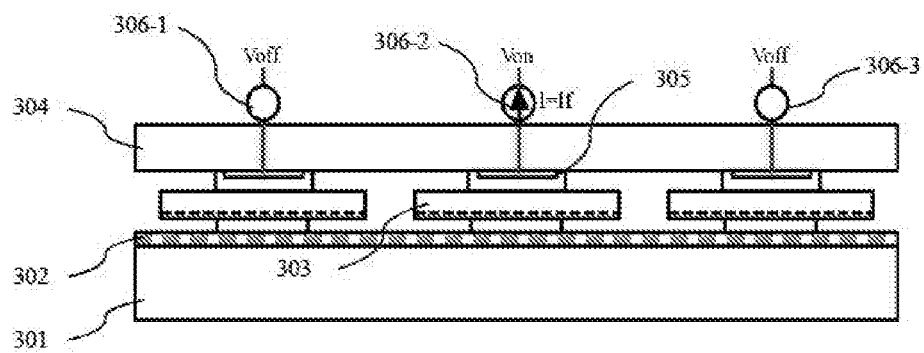

In FIG. 6, the pickup units 305 of the transfer head are brought in contact with the micro-LEDs 303 on the carrier substrate 301. The pickup units 305 are able to apply current to the micro-LEDs 303. Current is applied to the micro-LEDs via the pickup units 305 to heat up bonding layers 302 between the micro-LEDs 303 and the carrier substrate 301 to be melted. When the current flows through the micro-LED, a joule heating is produced.

For example, the current is applied in a selective or programmable manner. In FIG. 6, the current (forward current If) is applied to the micro-LEDs 303 at selective sites via the pickup units. For example, the current source 306-2 is switched on while the current sources 306-1 and 306-3 are switched off. So, the micro-LED 303 corresponding to the current source 306-2 is heated up.

For example, the bonding layer 302 can be conductive and forms a current loop with the micro-LED 303 and the pickup unit 305. The bonding layer 302 can be patterned. Alternatively, the bonding layer 302 can be un-patterned or blank to simply the manufacture flow.

For example, a few seconds or minutes after application of current, the bonding layer 302 between the micro-LED 303 and the carrier substrate 301 is melted. For example, a phase change of the bond layer 302 is taken place and thus the bottom side of the micro-LED is released from the carrier substrate.

For example, the pickup units 305 are the pickup units in FIG. 3 or 4. They include electrodes on a transfer substrate and a conductive adhesive layer on the electrodes. The current is applied via the electrodes and the conductive adhesive layer. In an example, the conductive adhesive layer is blank.

In an example, the conductive adhesive layer is a conductive photoresist layer. The conductive photoresist layer is cured during heating up the bonding layers between the micro-LEDs and the carrier substrate. Optionally, the conductive photoresist layer can be irradiated with light to enhance the curing thereof and a good bonding between the conductive adhesive layer and the micro-LED. For example, when the micro-LED is applied with current, it will irradiate light which can be used to cure the conductive photoresist layer.

The melting status of the bonding layer 302 between the micro-LEDs 303 and the carrier substrate 301 can be determined in many ways. For example, if the pickup units can lift up the micro-LEDs, it shows that the bonding layer 302 is melted.

Alternatively, the melting of the bonding layers 302 can be determined by monitoring an I-V characteristics of the micro-LEDs. As explained with FIG. 1 and FIG. 2, the temperature of a micro-LED and/or the bonding layer can be determined through the I-V characteristics.

Figure 7:
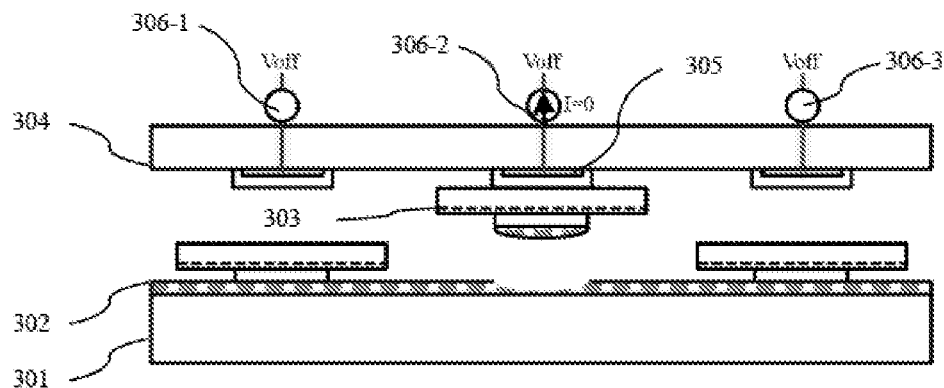

In FIG. 7, the micro-LEDs 303 are picked up from the carrier substrate 301 with the transfer head. For example, the micro-LEDs 303 are picked up by means of the conductive adhesive layer of the pickup units 305. Because the bonding layer 302 is melted, the grip force of the pickup unit is much higher than the bonding force (mainly surface tension) between the bond layer 302 and the carrier substrate 301.

Generally, only KGD micro-LEDs can conduct current and be heated up as required, and the bonding layer thereof is melted. Optionally, the conductive photoresist layer thereof is cured through the heating up. In this regard, only the KGD micro-LEDs may be picked up through this approach.

Figure 8:
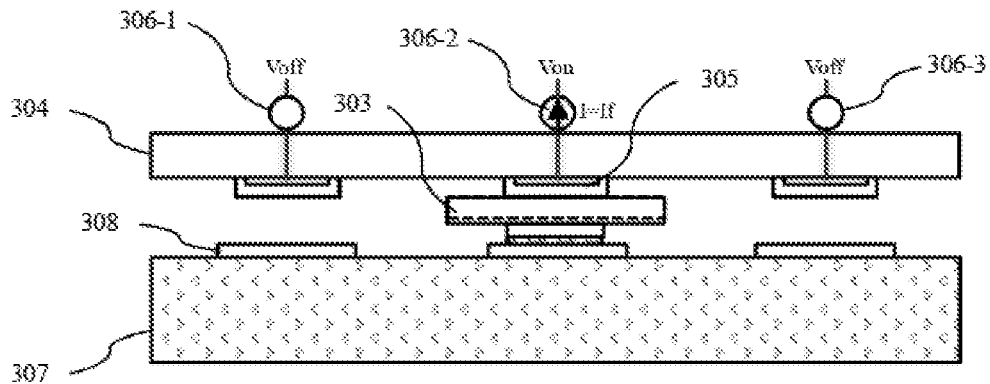

In FIG. 8, the micro-LEDs 303 are bonded onto a receiving substrate 307.

The micro-LEDs 303 may be placed on a bonding layer 308. As shown in FIG. 8, a forward current If is applied. In this regard, the micro-LEDs 303 are locally heated up and are bonded to the bonding layer 308.

Alternatively or optionally, a conventional approach of globally heating up all the receiving substrate 307 and the bonding layer 308 is also possible.

Figure 9:
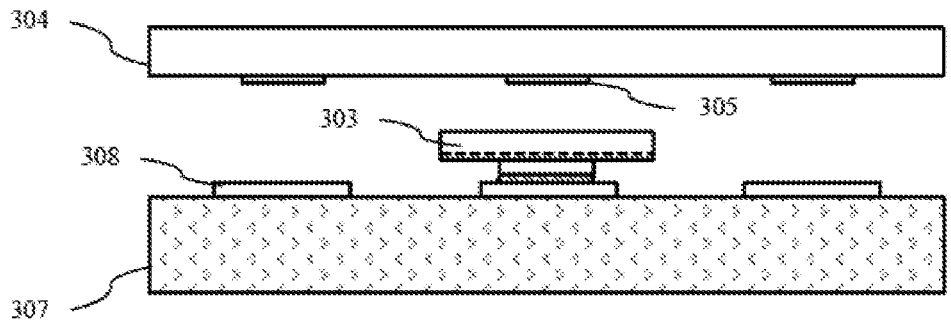

In FIG. 9, the transfer head is removed from the micro-LEDs 303.

After the micro-LEDs 303 are bonded onto the receiving substrate 307, the conductive adhesive layer of the pickup unit may be removed. For example, the conductive adhesive layer is a conductive photoresist layer and it is chemically removed so that the transfer head is lifted up.

Figure 10:
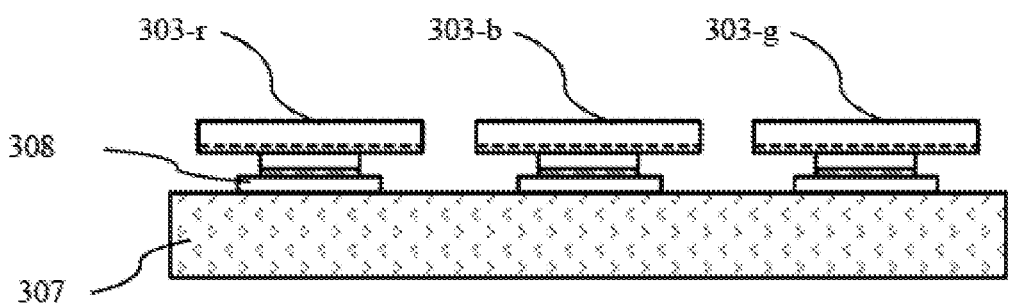

In FIG. 10, the above processes may be repeated to transfer micro-LEDs of three colors 303-r, 303-g, 303-b.

For an even better performance, the above transfer can be done at an elevated temperature environment below melting point of the bond layer. When the micro-LEDs are locally heated up, it may be easier to raise the temperature of the bond layer up to exceed the melting point.

Figure 11:
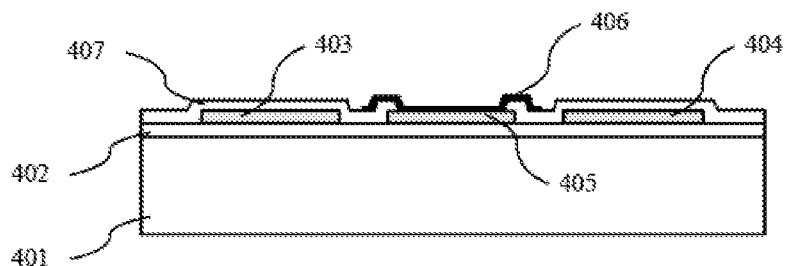
FIG. 11 shows a transfer head according to another embodiment of the present invention.

FIG. 11 shows a transfer head according to another embodiment of the present invention. In FIG. 11, the transfer head includes a transfer substrate 401 and a dielectric layer 402. The repetitive descriptions of the transfer head of FIG. 11 which are similar with those of FIG. 3 and FIG. 4 will be omitted.

In FIG. 11, the grip mechanism includes at least one picking up electrode, i.e. picking up electrodes 403 and 404. The current-applying mechanism includes at least one current-applying electrode, i.e. current-applying electrode 405.

The picking up electrode 403, 404 is covered with a dielectric layer 407. A metal probe 406 is mounted on the current-applying electrode 405 for applying current to a micro-LED.

In FIG. 11, one end of the metal probe 406 is mounted on the current-applying electrode 405 and another end thereof is mounted on the dielectric layer 407.

In this embodiment, the grip mechanism and the current-applying mechanism are separate. The grip mechanism can be used to apply electrostatic force and/or electromagnetic force.

Figure 12:
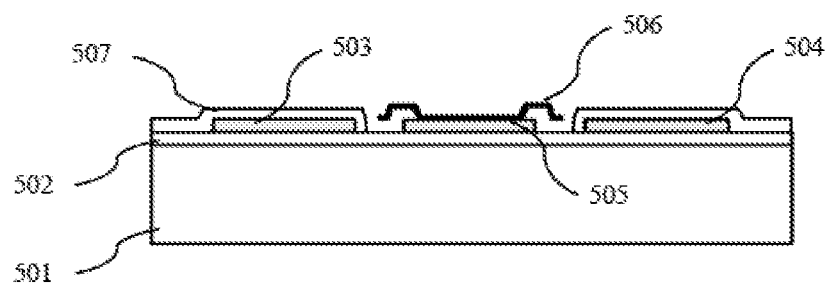
FIG. 12 shows a transfer head according to another embodiment of the present invention.

FIG. 12 shows a transfer head according to another embodiment of the present invention. As shown in FIG. 12, the transfer head includes a transfer substrate 501, a dielectric layer 502, picking up electrodes 503, 504, a current-applying electrode 505, a metal probe 506 and a dielectric layer 507. The corresponding parts of the transfer head of FIG. 12 are similar with those of FIG. 11 and the repetitive description thereof is omitted.

In FIG. 3 and FIG. 4, the conductive adhesive layer is soft-baked and the pickup unit is in flexible contact with a micro-LED on the carrier substrate. This may allow for a good contact with a micro-LED to be transferred. In FIG. 12, the metal probe 506 may also be flexible.

In FIG. 12, one end of the metal probe 506 is mounted on the current-applying electrode 505, and another end of the metal probe 506 is freestanding.

FIGS. 13-18 shows a process of transferring micro-LEDs from a carrier substrate to a receiving substrate according to another embodiment of the present invention. The repetitive description with FIGS. 5-10 will be omitted.

For example, in this embodiment, a transfer head of FIG. 11 or 12 may be used.

Figure 13:
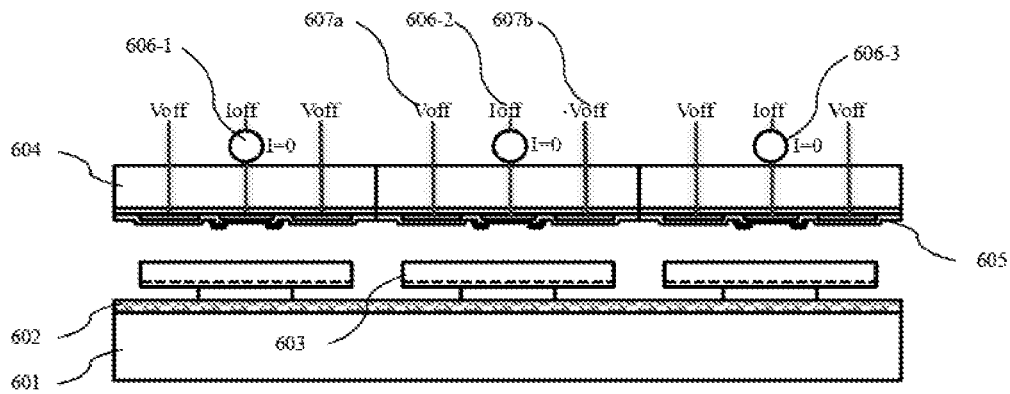
FIGS. 13-18 shows a process of transferring micro-LEDs from a carrier substrate to a receiving substrate according to another embodiment of the present invention.

In FIG. 13, the transfer head is aligned to a carrier substrate 601. The transfer head may include a transfer substrate 604 and pickup units 605. The pickup units 605 can apply current to micro-LEDs and pick up micro-LEDs.

For example, the transfer head can be a transfer head shown in FIG. 11 or 12. For example, each of the pickup units 605 may include at least one picking up electrode and at least one current-applying electrode. The picking up electrode is covered with a dielectric layer, and can apply electrostatic force and/or electromagnetic force. A metal probe is mounted on the current-applying electrode for applying current to the micro-LEDs 603 on the carrier substrate 601.

Current sources 606-1, 606-2, 606-3 are connected to the current-applying electrodes of the pickup units 305. Power sources 607a, 607b are connected to the picking up electrodes.

The micro-LEDs 603 are arranged on the carrier substrate 601 via a bonding layer 602. The bonding layer 602 can be conductive, for example.

Figure 14:
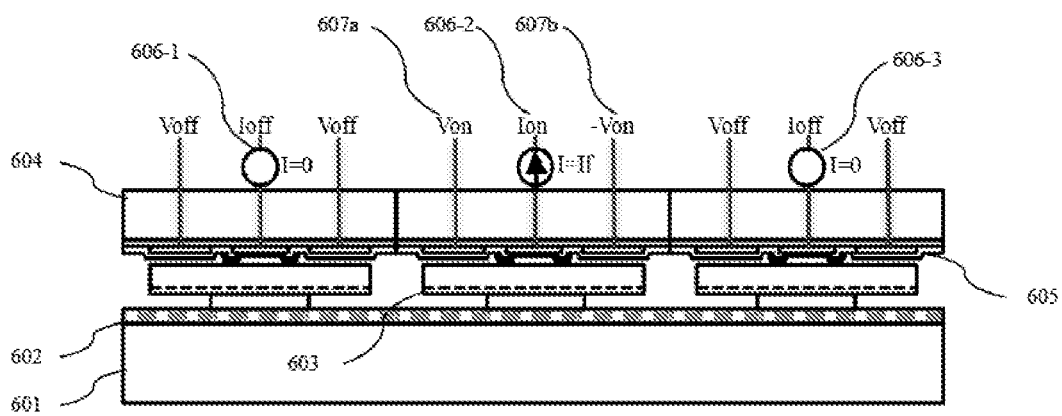

In FIG. 14, the pickup units 605 are brought in contact with the micro-LEDs 603 on the carrier substrate 601. For example, as explained above, the pickup units 605 can be in flexible contact with the micro-LEDs 603 on the carrier substrate 601 to reduce impact on the micro-LEDs and ensure a better contact. The pickup units 605 are able to apply current to the micro-LEDs. Current (forward current If) is applied to the micro-LEDs 603 via the pickup units 605 to heat up bonding layers 602 between the micro-LEDs 603 and the carrier substrate 601 to be melted. As shown in FIG. 14, the current is applied in a selective or programmable manner so that the current is applied to the micro-LEDs 603 at selective sites via the pickup units 605.

Figure 15:
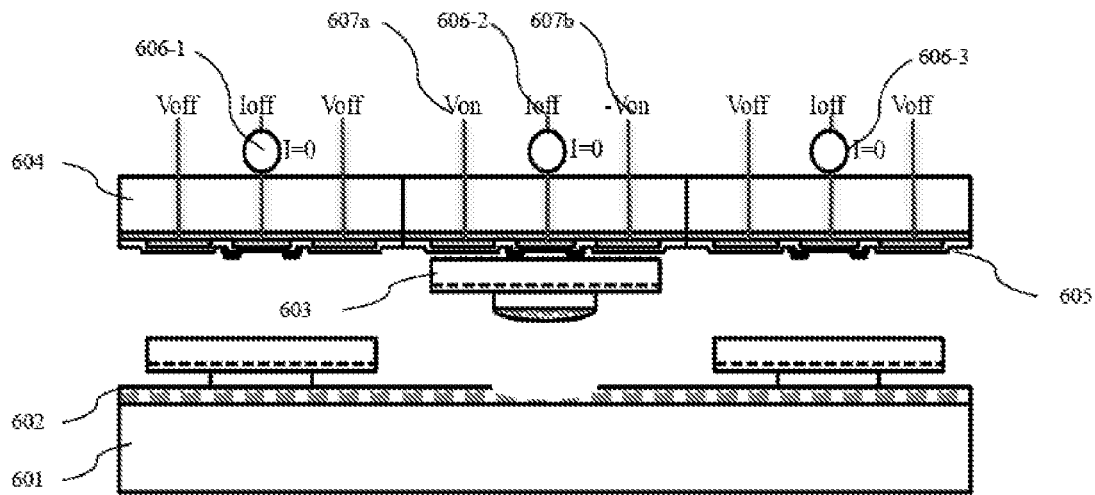

In FIG. 15, the micro-LEDs 603 are picked up from the carrier substrate 601 with the transfer head. As shown in FIG. 15, the power sources 607a, 607b are switched on (Von) to apply electrostatic force or electromagnetic force and the pickup units 605 pick up the micro-LEDs 603 from the carrier substrate 601 by the electrostatic force or electromagnetic force.

As explained above, this approach can also ensure that KDG micro-LEDs are picked up.

Figure 16:
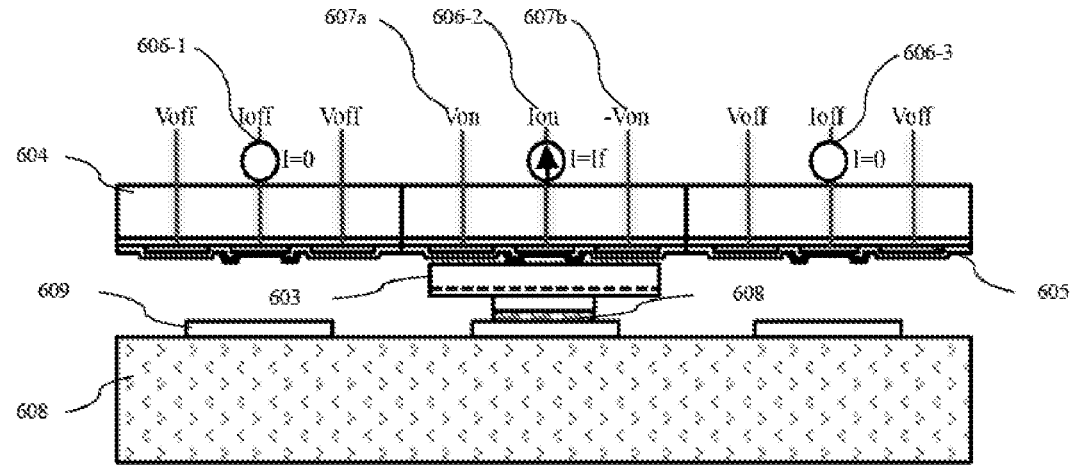

In FIG. 16, the transfer head picks up the micro-LEDs 603. The micro-LEDs 603 are moved and are bonded onto a receiving substrate 608 via a bonding layer 609.

As explained above, the bonding of the micro-LEDs 603 to the receiving substrate 608 can be performed through a global heating up or a local heating up by applying current If.

Figure 17:
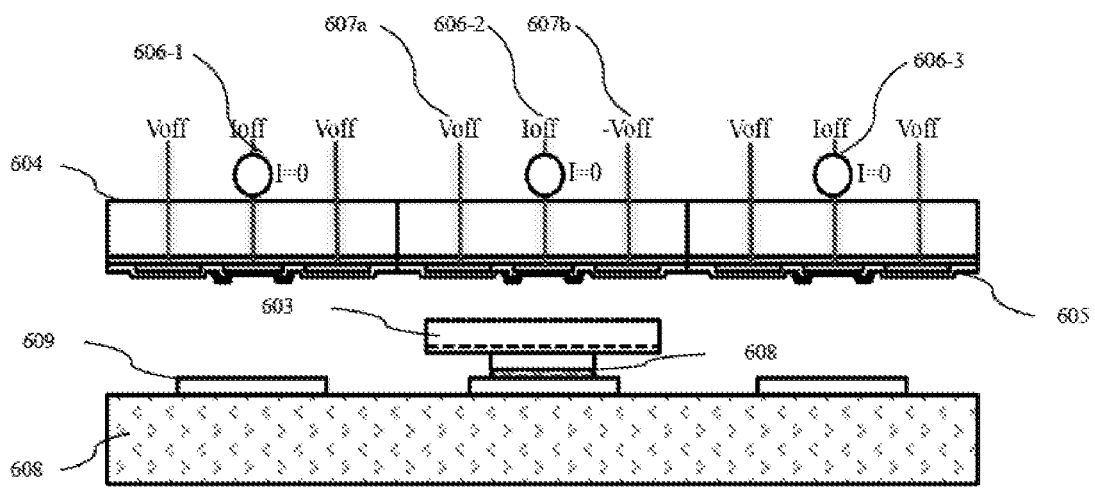

In FIG. 17, the power sources 607a, 607b are switched off (Voff) to release the micro-LEDs 603.

Figure 18:
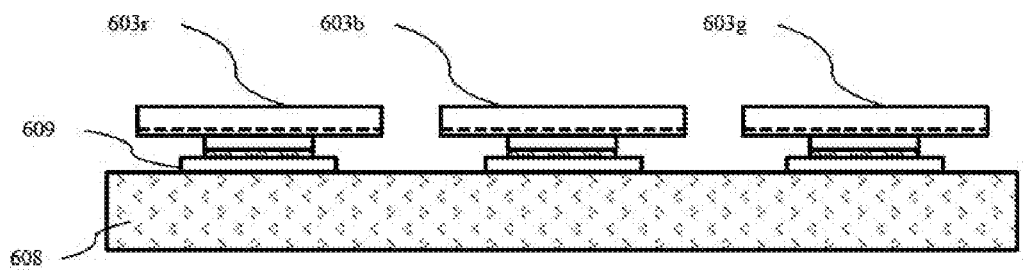

In FIG. 18, the above processes may be repeated to transfer micro-LEDs of three colors 603-r, 603-g, 603-b.

Figure 19:
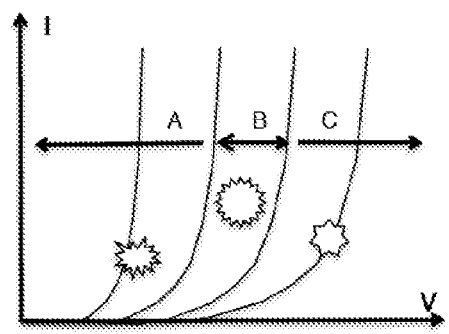
FIG. 19 is a schematic graph showing I-V characteristics of a micro-LED.

FIG. 19 is a schematic graph showing I-V characteristics of a micro-LED. The status or performance of a micro-LED can be determined from the I-V characteristics thereof.

The major defects of a micro-LED bonded on a carrier substrate include leakage which shows a low forward voltage Vf and open/bad contact which shows a high Vf. The leakage defect corresponds the area indicated by "A" in FIG. 19. The open/bad contact defect corresponds to the area indicated by "C" in FIG. 19. The area indicated by "B" in FIG. 19 is good die area.

These defects can be quickly determined by an I-V test. This I-V test may be combined with any prior art transfer. However, if such an I-V test is combined with the embodiments of this invention, because the transfer is performed by applying current to micro-LEDs, it is convenient to using the same or similar device to make such a test.

By this convenient test, only KGD micro-LEDs will be picked up and be transferred whilst defective micro-LEDs may be skipped. This will simplify or omit a following repair process on a receiving substrate.

FIGS. 20-25 shows a process of transferring micro-LEDs from a carrier substrate to a receiving substrate according to another embodiment of the present invention.

Figure 20:
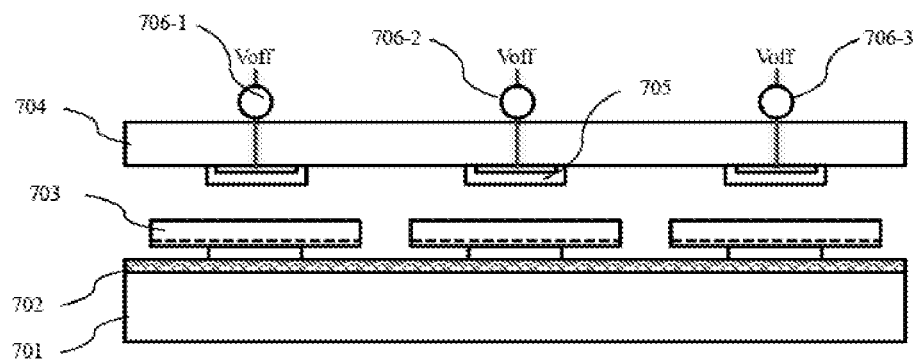
FIGS. 20-25 shows a process of transferring micro-LEDs from a carrier substrate to a receiving substrate according to another embodiment of the present invention.

In FIG. 20, the transfer head is aligned to carrier substrate 701. The transfer head may include a transfer substrate 7304 and pickup units 705. The pickup units 705 can apply current to micro-LEDs and pick up micro-LEDs. For example, the pickup units 705 can pick up micro-LEDs through at least one of adhesion force, electrostatic force, and electromagnetic force. For example, the transfer head can be a transfer head shown in FIGS. 3, 4, 11, 12.

Current sources 706-1, 706-2, 706-3 are connected to the pickup units 705.

Micro-LEDs 703 are arranged on the carrier substrate 701 via a bonding layer 702. The bonding layer 702 can be conductive, for example. The bonding layer 702 can be solder or metal bonding layer. The micro-LEDs 703 may be transferred from a growth substrate. The top side of the micro-LEDs 703 may be thinned to Ohmic contact region, for example by etching, milling, grinding, polishing. The thinned top side may be covered by a conductor layer.

Figure 21:
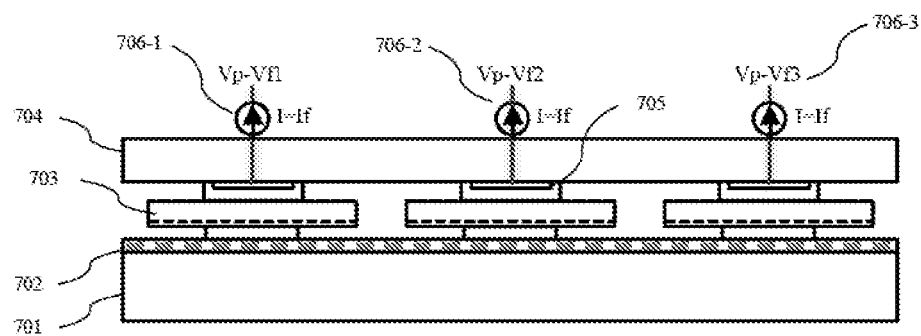

In FIG. 21, the pickup units 705 are brought in contact with micro-LEDs 703 on the carrier substrate 701. The pickup units 705 can apply current to the micro-LEDs 703. The pickup units 705 may be in flexible contact with the micro-LEDs 703.

As shown in FIG. 21, current (If) is applied to the micro-LEDs 703 via the pickup units 705 to obtain I-V characteristics of the micro-LEDs 703. For example, a voltage probe is arranged at each of the current sources 706-1, 706-2, 706-3 to detect the voltage. For example, the anodes of the micro-LEDs 703 are bonded on the bonding layer 702 of the carrier substrate 701. The bonding layer 702 is applied with positive voltage Vp. The detected voltage could be Vp-Vfi, i=1,2,3 . . . , wherein Vfi is a forward voltage of the ith micro-LEDs. The I-V characteristics may be determined in this way and known-good-die (KGD) micro-LEDs 703 on the carrier substrate 701 may be determined based on the I-V characteristics.

In addition, a light output of the micro-LEDs may also be measured to further ensure that the micro-LEDs to be transferred are good dies.

In FIGS. 22-25, the known-good-die micro-LEDs 703 are transferred from the carrier substrate 701 to a receiving substrate 708 by using the transfer head. A prior art transfer approach may be used in these processes. Alternatively, a transfer approach as explained in one of the above embodiments may be used in the transfer.

Figure 22:
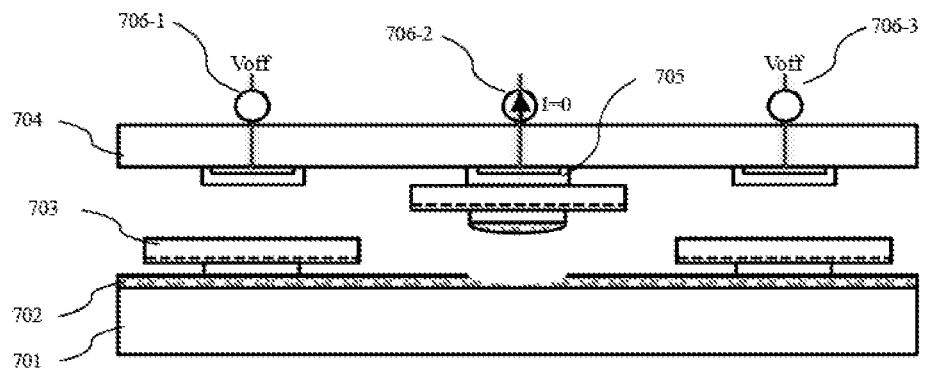

For example, in FIG. 22, current is selectively applied to the known-good-die micro-LEDs 703 via the pickup units 705 to heat up bonding layers 702 between the known-good-die micro-LEDs 703 and the carrier substrate 701 to be melted. The KGD micro-LEDs are picked up and are lifted up by the transfer head when the bond layer 702 is heated up to be above melting point and is melted.

For example, the pickup units 705 may include electrodes on a transfer substrate of the transfer head and a conductive adhesive layer on the electrodes. The current is applied via the electrodes and the conductive adhesive layer. As explained above, the conductive adhesive layer may be blank. The conductive adhesive layer may be a conductive photoresist layer. The conductive photoresist layer can be cured during heating up the bonding layers 702 between the known-good-die micro-LEDs 703 and the carrier substrate 701. The known-good-die micro-LEDs 703 can be picked up by means of the conductive adhesive layer.

For example, the pickup units 705 can pick up the known-good-die micro-LEDs 703 from the carrier substrate 701 by electrostatic force or electromagnetic force. For example, as explained above, each of the pickup units of the transfer head may include at least one picking up electrode and at least one current-applying electrode. The picking up electrode may be covered with a dielectric layer for applying electrostatic force or electromagnetic force. A metal probe is mounted on the current-applying electrode for applying current to the micro-LEDs on the carrier substrate.

As explained above, the melting of the bonding layers between the known-good-die micro-LEDs and the carrier substrate may be determined by monitoring an I-V characteristics of the known-good-die micro-LEDs.

Figure 23:
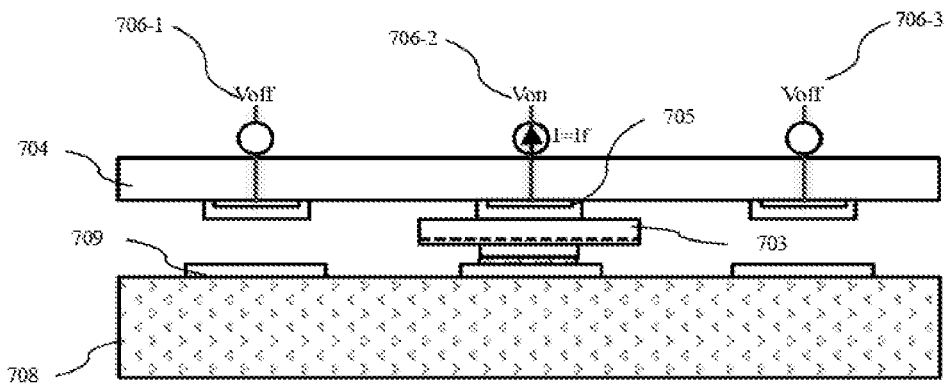

In FIG. 23, the known-good-die micro-LEDs are bonded onto a receiving substrate 708. This bonding can be performed in a global heating or local heating manner as explained above.

Figure 24:
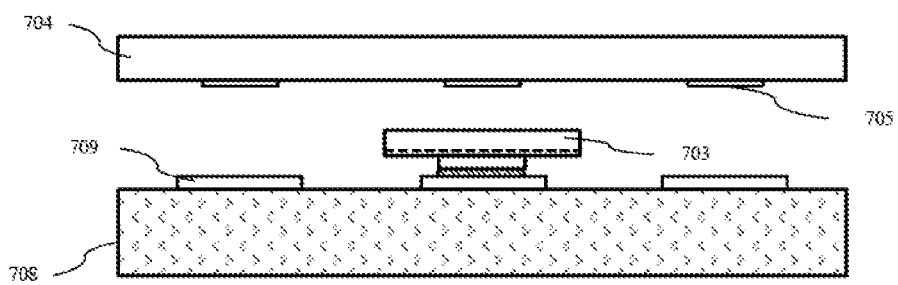

In FIG. 24, the transfer head is removed from the known-good-die micro-LEDs 703.

For example, the conductive adhesive layer on the pickup units 705 is removed after the known-good-die micro-LEDs 703 are bonded onto the receiving substrate 708. In a case of the conductive photoresist layer, it is chemically removed after the known-good-die micro-LEDs 703 are bonded onto the receiving substrate 708.

In a case of a transfer head of FIG. 11 or 12, it can be released by turning off the electrostatic/electromagnetic power.

Figure 25:
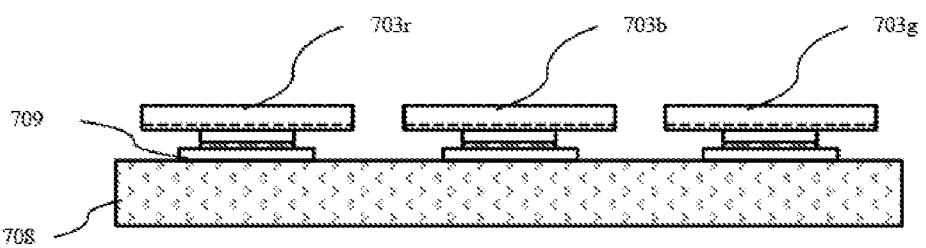

In FIG. 25, the above processes may be repeated to transfer micro-LEDs of three colors 703-r, 703-g, 703-b.

In another embodiment, the present invention further includes a method for method for manufacturing a micro-LED device. The manufacturing method comprises transferring micro-LEDs onto a receiving substrate of the micro-LED device by using the micro-LED transfer method according to the present invention or by using the transfer head according to the present invention.

In another embodiment, the present invention further includes a micro-LED device, such as a display screen device or display panel. The micro-LED device can be manufactured by using the method for manufacturing a micro-LED device according to the present invention.

In another embodiment, the present invention further includes an electronic apparatus. The electronic apparatus contains a micro-LED device according to the present invention. For example, the electronic apparatus can be a mobile phone, a pad computer and so on.

The transfer head according to the embodiments of the present invention may be described as below.

EEEE1. A transfer head, comprising: a transfer substrate; and pickup units mounted on a surface of the transfer substrate, wherein at least one of the pickup units includes a grip mechanism and a current-applying mechanism, the grip mechanism is able to capture a micro-LED, and the current-applying mechanism is able to apply current to the micro-LED so that a bonding layer between the micro-LED and a carrier substrate is heated up to be melted.

EEEE2. The transfer head according to EEEE1, wherein the grip mechanism captures the micro-LED through at least one of adhesion force, electrostatic force, and electromagnetic force.

EEEE3. The transfer head according to EEEE1 or EEEE2, wherein a voltage across the micro-LED is monitored during the current-applying mechanism is applying current to the micro-LED.

EEEE4. The transfer head according to any of EEEE1 to EEEE3, wherein the current-applying mechanism includes an electrode on the transfer substrate, and the grip mechanism includes a conductive adhesive layer on the electrode, wherein the electrode applies current to the micro-LED via the conductive adhesive layer, and the micro-LED is picked up by means of the conductive adhesive layer.

EEEE5. The transfer head according to any of EEEE1 to EEEE4, wherein the conductive adhesive layer is able to be removed after the micro-LEDs are bonded onto a receiving substrate.

EEEE6. The transfer head according to any of EEEE1 to EEEE5, wherein the conductive adhesive layer on multiple of the pickup units is blank.

EEEE7. The transfer head according to any of EEEE1 to EEEE6, wherein the conductive adhesive layer is a conductive photoresist layer, wherein the conductive photoresist layer is able to be cured during the bonding layer between the micro-LED and a carrier substrate is heated up, and wherein the conductive photoresist layer is able to be chemically removed after the micro-LEDs are bonded onto a receiving substrate.

EEEE8. The transfer head according to any of EEEE1 to EEEE7, wherein the pickup unit is in flexible contact with the micro-LED on the carrier substrate.

EEEE9. The transfer head according to any of EEEE1 to EEEE8, wherein the grip mechanism includes at least one picking up electrode and the current-applying mechanism includes at least one current-applying electrode, wherein the picking up electrode is covered with a dielectric layer, wherein a metal probe is mounted on the current-applying electrode for applying current to the micro-LED.

EEEE10. The transfer head according to any of EEEE1 to EEEE9, wherein the metal probe is flexible.

EEEE11. The transfer head according to any of EEEE1 to EEEE10, wherein one end of the metal probe is mounted on the current-applying electrode, and another end of the metal probe is freestanding.

Although some specific embodiments of the present invention have been demonstrated in detail with examples, it should be understood by a person skilled in the art that the above examples are only intended to be illustrative but not to limit the scope of the present invention.

What is claimed is:

1. A micro-LED transfer method, comprising:
    bringing pickup units of a transfer head in contact with micro-LEDs on a carrier substrate, wherein the pickup units are able to apply current to the micro-LEDs;
    applying current to the micro-LEDs via the pickup units to obtain I-V characteristics of the micro-LEDs;
    determining known-good-die micro-LEDs based on the I-V characteristics; and
    transferring the known-good-die micro-LEDs from the carrier substrate to a receiving substrate by using the transfer head.

2. The method according to claim 1, wherein transferring the known-good-die micro-LEDs further comprising:
    applying current to the known-good-die micro-LEDs via the pickup units to heat up bonding layers between the known-good-die micro-LEDs and the carrier substrate to be melted;
    picking up the known-good-die micro-LEDs from the carrier substrate with the transfer head;
    bonding the known-good-die micro-LEDs onto a receiving substrate; and
    removing the transfer head from the known-good-die micro-LEDs.

3. The method according to claim 1, wherein the pickup units include electrodes on a transfer substrate of the transfer head and a conductive adhesive layer on the electrodes;
    wherein the current is applied via the electrodes and the conductive adhesive layer;
    wherein the known-good-die micro-LEDs are picked up by means of the conductive adhesive layer; and
    wherein the conductive adhesive layer is removed after the known-good-die micro-LEDs are bonded onto the receiving substrate.

4. The method according to claim 3, wherein the conductive adhesive layer is blank.

5. The method according to claim 3, wherein the conductive adhesive layer is a conductive photoresist layer,
    wherein the conductive photoresist layer is cured during heating up the bonding layers between the known-good-die micro-LEDs and the carrier substrate, and
    wherein the conductive photoresist layer is chemically removed after the known-good-die micro-LEDs are bonded onto the receiving substrate.

6. The method according to claim 1, wherein the pickup units of the transfer head are in flexible contact with the micro-LEDs on the carrier substrate.

7. The method according to claim 1, wherein the pickup units of the transfer head pick up the known-good-die micro-LEDs from the carrier substrate by electrostatic force or electromagnetic force.

8. The method according to claim 1, wherein each of the pickup units of the transfer head includes at least one picking up electrode and at least one current-applying electrode,
    wherein the picking up electrode is covered with a dielectric layer,
    wherein a metal probe is mounted on the current-applying electrode for applying current to the micro-LEDs on the carrier substrate.

9. The method according to claim 1, wherein the melting of the bonding layers between the known-good-die micro-LEDs and the carrier substrate is determined by monitoring an I-V characteristics of the known-good-die micro-LEDs.

10. A method for manufacturing a micro-LED device, comprising transferring micro-LEDs onto a receiving substrate of the micro-LED device by using the micro-LED transfer method according to claim 1.

* * * * *